(12) United States Patent
Basin et al.

(10) Patent No.: US 7,847,302 B2
(45) Date of Patent: Dec. 7, 2010

(54) BLUE LED WITH PHOSPHOR LAYER FOR PRODUCING WHITE LIGHT AND DIFFERENT PHOSPHOR IN OUTER LENS FOR REDUCING COLOR TEMPERATURE

(75) Inventors: Grigoriy Basin, San Francisco, CA (US); Paul S. Martin, Pleasanton, CA (US); Robert Scott West, Morgan Hill, CA (US); Yasumasa Morita, Sunnyvale, CA (US); Tewe Heemstra, Veldhoven (NL)

(73) Assignees: Koninklijke Philips Electronics, N.V., Eindhoven (NL); Philips Lumileds Lighting, LLC, San Jose, CA (US)

( * ) Notice: Subject to any disclaimer, the term of this patent is extended or adjusted under 35 U.S.C. 154(b) by 53 days.

(21) Appl. No.: 11/212,280

(22) Filed: Aug. 26, 2005

(65) Prior Publication Data

US 2007/0045761 A1    Mar. 1, 2007

(51) Int. Cl.
*H01L 33/00* (2010.01)
*H01J 1/62* (2006.01)

(52) U.S. Cl. .............. 257/88; 257/79; 257/89; 257/98; 257/100; 257/E33.049; 257/E33.059; 257/E33.061; 257/E33.067; 438/22; 438/47; 438/48

(58) Field of Classification Search ........... 257/88–100, 257/79, E33.049, E33.059, E33.061, E33.067; 438/29, 22, 47, 48
See application file for complete search history.

(56) References Cited

U.S. PATENT DOCUMENTS

| | | | | |
|---|---|---|---|---|
| 5,091,769 A | * | 2/1992 | Eichelberger | 257/687 |
| 5,102,579 A | * | 4/1992 | Inaho et al. | 252/301.4 S |
| 5,130,531 A | * | 7/1992 | Ito et al. | 250/216 |
| 5,353,498 A | * | 10/1994 | Fillion et al. | 29/840 |
| 5,847,507 A | * | 12/1998 | Butterworth et al. | 313/512 |
| 5,886,401 A | * | 3/1999 | Liu | 257/678 |
| 6,252,254 B1 | * | 6/2001 | Soules et al. | 257/89 |
| 6,576,488 B2 | | 6/2003 | Collins, III et al. | |
| 6,603,148 B1 | * | 8/2003 | Sano et al. | 257/98 |
| 6,614,179 B1 | * | 9/2003 | Shimizu et al. | 313/512 |
| 6,642,652 B2 | | 11/2003 | Collins, III et al. | |
| 6,682,331 B1 | | 1/2004 | Peh et al. | |
| 6,717,353 B1 | | 4/2004 | Mueller et al. | |
| 2001/0026011 A1 | | 10/2001 | Roberts et al. | |
| 2001/0050371 A1 | * | 12/2001 | Odaki et al. | 257/98 |
| 2002/0187571 A1 | * | 12/2002 | Collins et al. | 438/29 |
| 2003/0006702 A1 | * | 1/2003 | Mueller-Mach et al. | 313/512 |
| 2003/0209714 A1 | * | 11/2003 | Taskar et al. | 257/79 |
| 2004/0012027 A1 | * | 1/2004 | Keller et al. | 257/79 |
| 2004/0100192 A1 | * | 5/2004 | Yano et al. | 313/512 |
| 2004/0173806 A1 | * | 9/2004 | Chua | 257/98 |
| 2005/0151147 A1 | | 7/2005 | Izuno et al. | |
| 2006/0124947 A1 | * | 6/2006 | Mueller et al. | 257/98 |

\* cited by examiner

*Primary Examiner*—Dao H Nguyen

(57) ABSTRACT

A technique for forming a white light LED is disclosed. In one embodiment, the LED emits blue light. A first phosphor for producing red, yellow, yellow-green, or green light is formed to conformably coat the LED die. One suitable deposition technique is electrophoretic deposition (EPD). Over the resulting LED structure is deposited another phosphor (to add the remaining color component) in a binder (e.g., silicone) for encapsulating the die. The blue LED light combines with the two phosphor colors to create white light. Since the two different deposition techniques are independent and easily controllable, the resulting white light temperature is highly controllable and the color emission is substantially uniform.

12 Claims, 4 Drawing Sheets

BLUE LED WITH PHOSPHOR LAYER FOR PRODUCING WHITE LIGHT AND DIFFERENT PHOSPHOR IN OUTER LENS FOR REDUCING COLOR TEMPERATURE

FIELD OF THE INVENTION

This invention relates to light emitting diodes (LEDs) and, in particular, to a technique for converting an LEDs light output to a white light.

BACKGROUND

LEDs emit light of a single color. It is common practice to create white light using a blue LED and irradiating one or more phosphors. The phosphor may add red and green components or may add a yellow-green component (e.g., a YAG phosphor). Such techniques include depositing the phosphor(s) in a reflective cup surrounding the blue LED, or mixing the phosphors in a bonding medium (e.g., silicone) and depositing the mixture on the blue LED.

Using a yellow-green phosphor with a blue LED produces a high temperature white light that is not visually pleasing and has poor color rendering. Adding a red phosphor makes the light warmer.

Providing the phosphors in a reflector cup surrounding the LED results in a relatively large light source. Further, the thickness of the phosphor/binder material in the cup varies, making it difficult to achieve a desired color temperature and uniform color. Further, the walls of the cup block the sidelight, which limits the possible emission patterns. Other drawbacks exist.

When depositing two or more phosphors in conjunction, it is difficult to create a predictable and consistent light color, and the different phosphors may react differently during the same deposition process. For example, the relative phosphor thicknesses and densities are difficult to control, the light conversion of one phosphor has an effect on the light conversion of the other phosphor, and different phosphors typically have different physical properties (e.g., density differences and temperature coefficients of expansion) and chemical properties so do not react the same when undergoing the same deposition process.

What is needed is a technique for generating white light using phosphors and a blue, UV, or near UV LED that is relatively easy to implement and consistently produces the desired white light temperature. It is particularly desirable to generate a warm white light (more red) in the temperature range of 2000K-5000K.

SUMMARY

A technique for forming a white light LED is disclosed. In one embodiment, the LED die emits blue light. A first phosphor for producing red, yellow, or yellow-green light is deposited to conformably coat the LED die. One suitable deposition technique is electrophoretic deposition (EPD), which plates the die with a phosphor by applying a potential to the die and charging the phosphor in a solution. The attractive force evenly coats the die with the phosphor. The phosphor thickness and coverage is very controllable, so the effect of the phosphor coating is very predictable.

Over the resulting LED structure is deposited another phosphor in a binder to add the remaining color component (e.g., red or green) and to encapsulate the conformal phosphor coated die.

Because the two different deposition techniques are, separately, easily controllable to contribute the desired color component, since the phosphors' physical and chemical compatibility is not a factor, the resulting white light temperature (e.g., 2000K-5000K) is highly controllable and the emission color is uniform.

One use of the warm white light LEDs is in headlamps for automobiles.

In one embodiment, an array of blue LED dies is mounted on a submount, and each LED has a conformal coating of a first phosphor formed over it. Each LED is then surrounded by a photoresist mold, and liquid silicone infused with a second phosphor is deposited in the mold to form an encapsulant over each LED with well defined dimensions. The silicone is then cured, and the photoresist is removed. The LEDs are separated from one another by a conventional dicing step. The first phosphor may be yellow, yellow-green, or green (e.g., a YAG phosphor) and the second phosphor may be red (e.g., a CaS phosphor). In another embodiment, the first phosphor is red, and the second phosphor is yellow, yellow-green, or green.

In another embodiment, the silicone-phosphor material is deposited in an overmolding process, where LEDs conformably coated with phosphor in an array on a submount are placed over a mold containing liquid silicone mixed with phosphor powder. The shape of each mold is that of a lens. The silicone-phosphor material is then cured and the LED array and mold are separated. Each LED structure now includes the two phosphors and a silicone lens. The LEDs may then be separated from each other by a conventional dicing procedure.

DETAILED DESCRIPTION

As a preliminary matter, a conventional blue, UV, or near-UV LED is formed on a growth substrate. In the example used, the LED is a GaN-based LED, such as an AlInGaN LED. Typically, a relatively thick n-type GaN layer is grown on a sapphire or SiC growth substrate using conventional techniques. The relatively thick GaN layer typically includes a low temperature nucleation layer and one or more additional layers so as to provide a low-defect lattice structure for the n-type cladding layer and active layer. One or more n-type cladding layers are then formed over the thick n-type layer, followed by an active layer, one or more p-type cladding layers, and a p-type contact layer (for metallization).

Various techniques are used to gain electrical access to the n-layers. In a flip-chip example, portions of the p-layers and active layer are etched away to expose an n-layer for metallization. In this way the p contact and n contact are on the same side of the chip and can be directly electrically attached to the package (or submount) contact pads. Current from the n-metal contact initially flows laterally through the layer. In contrast, in a vertical injection (non-flip-chip) LED, an n-contact is formed on one side of the chip, and a p-contact is formed on the other side of the chip. Electrical contact to one of the p or n-contacts is typically made with a wire or a metal bridge, and the other contact is directly bonded to a package (or submount) contact pad. A flip-chip LED is used in the various examples for simplicity, although a vertical injection LED can also be used.

Optionally, a conductive substrate is bonded to the LED layers (typically to the p-layers) and the growth substrate is removed.

Examples of forming LEDs are described in U.S. Pat. Nos. 6,649,440 and 6,274,399, both assigned to Lumileds Lighting and incorporated by reference.

The n and p contacts of one or more LED dice may be bonded to respective contact pads on a submount. The submount may be silicon, ceramic, or any other suitable material. The submount has additional contact pads for being connected to a printed circuit board. Conductive vias in the submount may connect the LED pads to the printed circuit board pads. The submount may have a metal pattern that interconnects multiple LEDs together on the submount. The submount may contain additional circuitry, such as ESD protection. Multiple submounts may be bonded to a printed circuit board, which typically contains metal leads for interconnecting the LEDs and for connecting the LEDs to a power supply. The circuit board may interconnect various LEDs in series and/or parallel.

The above-described LED structures are just some examples of LED structures that can be used in the present invention.

Figure 1:
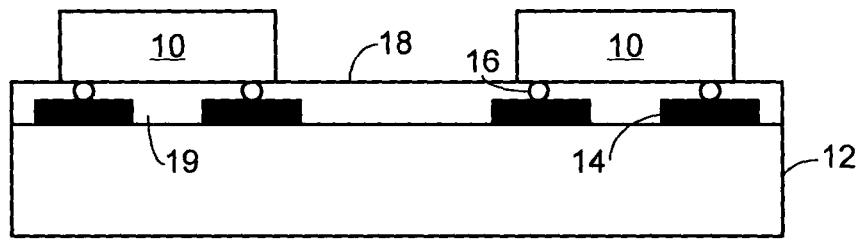
FIG. 1 is a side view of an array of blue LEDs, with conductive surfaces, mounted on a submount.

FIG. 1 is a side view of two flip-chip LED dice 10 mounted on a support structure 12. It is assumed the LEDs emit a blue light in the range of 420-490 nm. The support structure 12 may be a submount (e.g., ceramic or silicon with metal leads), a metal heat sink, a printed circuit board, or any other structure. In the present example, the support structure 12 is a ceramic submount with metal pads 14 connected to the n and p contact pads of the LED dice 10 by gold bumps 16 or by any other bonding means.

A photoresist 18 is deposited over the surface of the support structure 12 and removed (e.g., by lift off or etching) from the surfaces of the LED dice 10 where phosphor is to be deposited. An underfill 19 of another material may be present under each LED die 10. The underfill provides heat transfer to the support structure 12 and protects the LED dice 10 from contamination.

Typically, the exposed surfaces of the LED dice 10 will be conductive n or p layers and electrically connected to metal leads on the support structure 12. If the surfaces are not conductive, the LED dice 10 may be dipped in a solution of, for example, antimony tin oxide, and dried to provide a mildly conductive coating on the LED dice 10.

Figure 2:
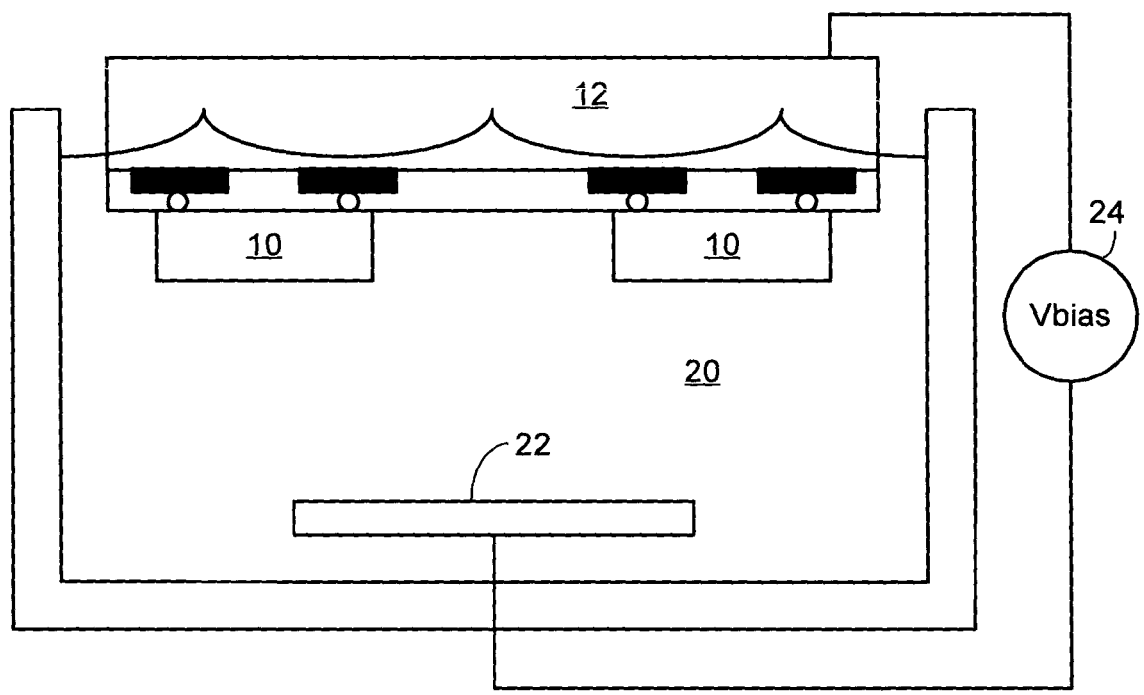
FIG. 2 illustrates the array of LEDs immersed in a solution containing charged phosphor particles for conformably coating the conductive surfaces of the LEDs with the phosphor.

FIG. 2 shows a tub containing a first phosphor powder in a solution 20. The solution 20 may contain a binder material and/or a charging agent in addition to the phosphor particles. An exemplary solution 20 may include isopropyl alcohol and water as a solvent, aluminum nitride as a charging agent and binding agent, and a doped yttrium aluminum garnet compound as phosphor particles. In this example, the first phosphor for conformably coating the LED dice 10 will generate yellow or yellow-green light when energized by the blue light emitted by the LED dice 10. Such phosphors for generating particular colors when energized by blue light are well known.

An electrode 22 in contact with the solution 20 is coupled to one terminal of a bias voltage source 24, and the conductive surfaces of the LED dice 10 are coupled (via pads on the submount 12) to the other terminal of the bias voltage source 24. The electric field created by the bias voltage draws the phosphor particles out of the solution 20 and onto the charged conductive surfaces of the LED dice 10.

At the time when the phosphor coating is of a sufficient thickness (empirically determined), the support structure 12 is removed from the solution 20 and dried. Any variation in the thickness of the phosphor is preferably less than about 15% of the average thickness of the phosphor and preferably less than 10% of the average thickness. The photoresist layer 18 is then removed by conventional wet (acetone) or dry (oxygen plasma) stripping.

Figure 3:
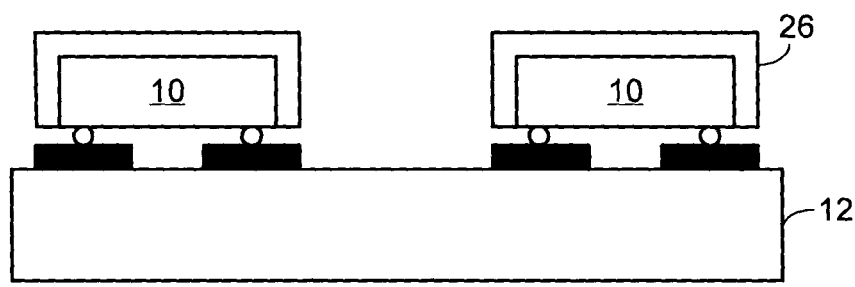
FIG. 3 illustrates the resulting LEDs with the conformal coating of phosphor.

FIG. 3 illustrates the resulting phosphor conformal layer 26 on the LED dice 10 surfaces.

As an alternative to forming the conformal coating by electrophoretic deposition, tenciling may also be used. Electrophoretic deposition and stenciling are further described n U.S. Pat. Nos. 6,576,488 and 6,642,652, by William David Collins III et al., assigned to the present assignee and incorporated herein by reference.

Instead of depositing a conformal layer of yellow or yellow-green phosphor on the LED dice 10, the conformal layer 26 may be a red phosphor (CaS:Eu), deposited using the same techniques. Such red phosphors that emit red light (e.g., 630-675 nm) when energized by a blue light are well known.

In one embodiment, the thickness of the conformal layer 26 is 15-35 microns; however, other thicknesses may also be suitable depending on the desired color temperature, the phosphors used, and the particular LEDs used.

Figure 4:
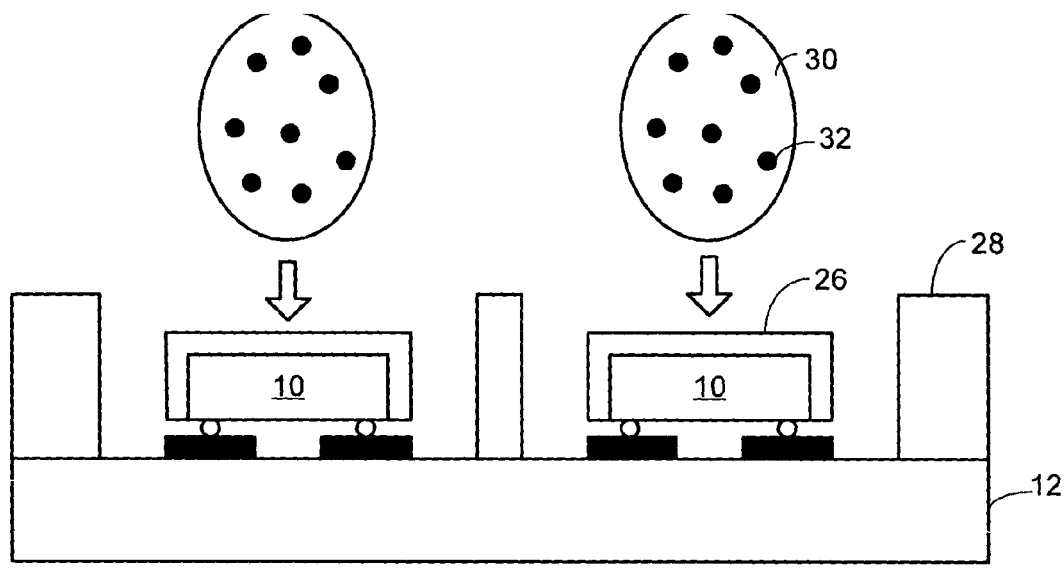
FIG. 4 illustrates a photoresist formed over the submount of FIG. 3 to form a mold for silicone infused with a second type of phosphor.

Next, as shown in FIG. 4, a layer of photoresist 28 is deposited and selectively removed around each LED die 10 to create a mold for forming a lens comprising silicone 30 infused with a second type of phosphor 32. Silicone is particularly suitable for forming a lens since it is transparent and durable. However, other materials may also be suitable. If the conformal layer 26 is a yellow phosphor or yellow-green phosphor, the phosphor 32 should be a red phosphor to create a warm white light. Some blue light emitted by the LED die 10 leaks through the two phosphors and combines with the two phosphor colors to create white light. The red phosphor is energized by both the blue and green components. If the conformal layer 26 is a red phosphor, the phosphor 32 should be a green phosphor to create white light. Phosphors that emit green light (e.g., 520-570 nm) when energized by blue light are well known (e.g., YAG doped with Ce+3).

A precisely controlled drop of the liquid silicone-phosphor is shown being deposited into the mold. The viscosity of the droplet is set so that the convex meniscus forms the desired lens shape (see FIG. 5). In one embodiment using a red phosphor 32, there is a concentration of 0.3 gram of CaS:Eu for every 5 grams of silicone. The required concentration of any type of phosphor in silicone can be easily determined empirically. By varying the thickness of the conformal coating 26 of phosphor and the concentration of phosphor 32 in the silicone, the color temperature can be easily adjusted.

In another embodiment, the silicone infused with phosphor is deposited over the entire surface, and the structure is spun to remove the silicone outside of the mold.

Figure 5:
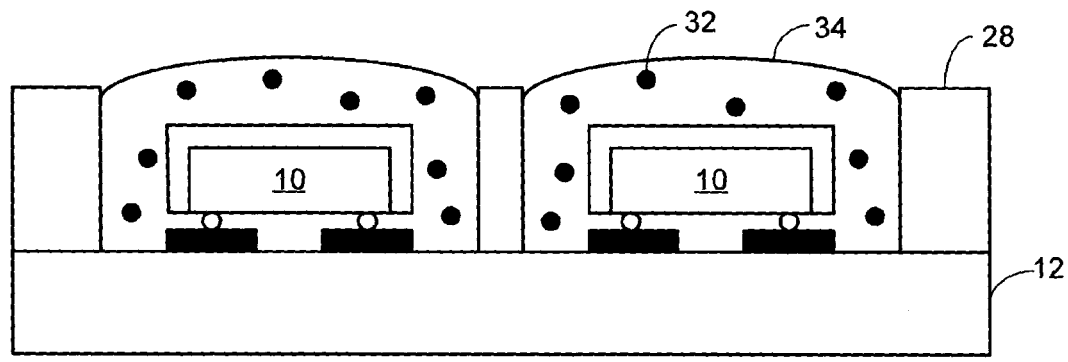
FIG. 5 illustrates the resulting silicone, containing phosphor particles, forming an encapsulating lens, prior to the photoresist being removed.

FIG. 5 shows the resulting lens 34. Additional lenses may be formed over the lens 34 for further affecting the light emission pattern. The silicone is then cured. The LED die 10 is now encapsulated or substantially encapsulated by the silicone. The bottom surface of the LED die 10 may be protected by an underfill, so it is not necessary that the silicone completely surround the LED die 10 for sufficient encapsulation. In one embodiment, the total thickness of the conformal layer 26 and lens 34 is about 75 microns or greater.

The photoresist 28 is then removed.

Figure 6:
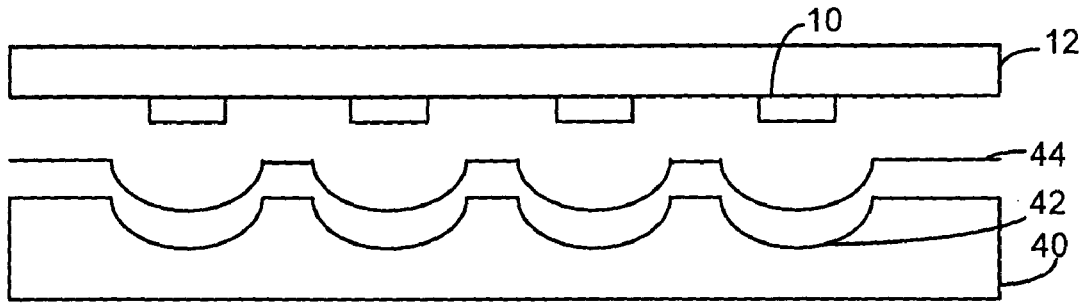
FIGS. 6, 7, and 8 illustrate an overmolding process used to form an encapsulating lens containing phosphor particles.
Figure 7:
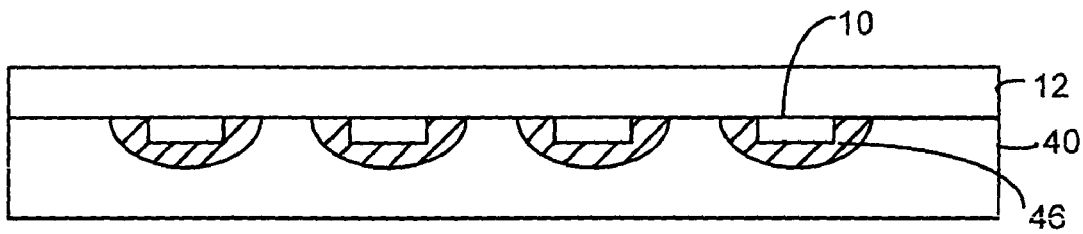
Figure 8:
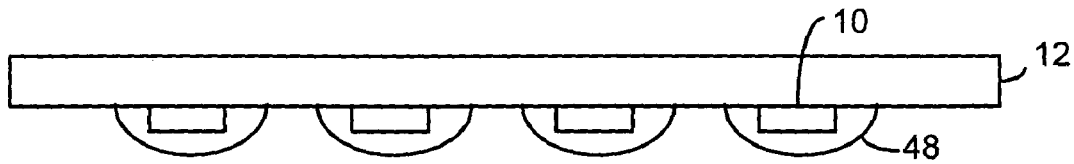

FIGS. 6-8 illustrate another technique for encapsulating the LED dice 10 with a silicone-phosphor lens. Each LED die has a conformal layer of phosphor prior to encapsulation, as previously described.

In FIG. 6, a mold 40 has indentations 42 corresponding to the desired shape of a lens over each LED die 10. The mold 40 is preferably formed of a metal. A very thin non-stick film 44, having the general shape of the mold 40, is placed over the mold 40. The film 44 is of a well known conventional material that prevents the sticking of silicone to metal. Film 44 is not needed if the lens material does not stick to the mold This may be accomplished by using a non-stick mold coating, using a non-stick mold material, or using a mold process that results in a non-stick interface. Such processes may involve selecting certain process temperatures to obtain the minimum stick. By not using the film 44, more complex lenses can be formed.

In FIG. 7, the mold indentions 42 have been filled with a heat-curable or UV-curable liquid lens material 46 infused with a phosphor. Such phosphor has been previously described with respect to FIG. 4. The lens material 46 may be any suitable optically transparent material such as silicone, an epoxy, or a hybrid silicone/epoxy. A hybrid may be used to achieve a matching coefficient of thermal expansion (CTE). Silicone and epoxy have a sufficiently high index of refraction (greater than 1.4) to greatly improve the light extraction from an AlInGaN LED as well as act as a lens. One type of silicone has an index of refraction of 1.76.

A vacuum seal is created between the periphery of the support structure 12 and the mold 40, and the two pieces are pressed against each other so that each LED die 10 is inserted into the liquid lens material 46 and the lens material 46 is under compression.

The mold 40 is then heated to about 150 degrees centigrade (or other suitable temperature) for a time to harden the lens material 46.

The support structure 12 is then separated from the mold 40. The film 44 causes the resulting hardened lens to be easily released from the mold 40. The film 44 is then removed.

In another embodiment, the LED dice 10 in FIG. 6 may be first covered with a layer of silicone (or another binder) infused with phosphor, and the silicone is then cured. The mold indentations 42 are filled with silicone or another material. When the LED dice 10 are then placed in the mold, the mold material is shaped over the covering material to form a lens. This technique may be used if the cover layer is not to be used as a lens.

FIG. 8 illustrates the resulting structure with a molded lens 48 over each LED die 10.

In one embodiment, the molded lens is between 1 mm and 5 mm in diameter. The lens 48 may be any size or shape. The resulting LEDs emit white light by the combination of the blue light and the light emitted by the two phosphors.

One or more additional lenses may be formed over the conformal layer 26 and the first silicone-phosphor coating by any of the above methods. The one ore more additional lenses may contain another type of phosphor, such as for emitting orange light, to create a more pleasing light.

Figure 9:
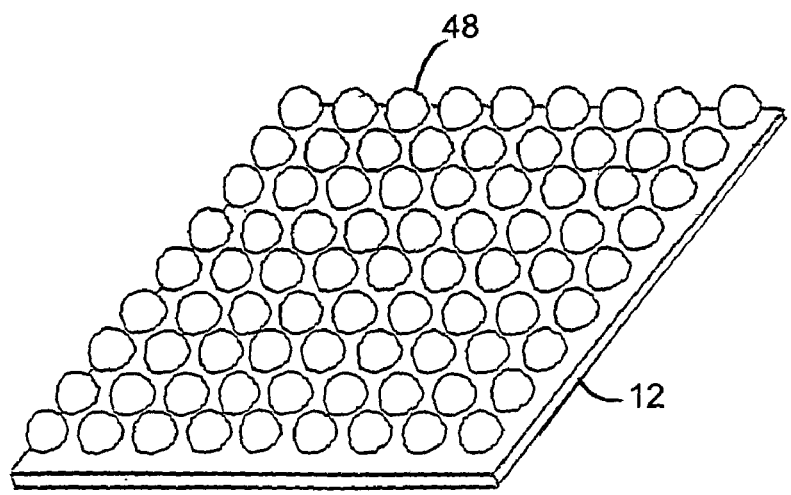
FIG. 9 is a perspective view of an array of LEDs that emit white light, formed using he processes described herein.

FIG. 9 is a perspective view of a resulting structure where the support structure 12 supports an array of LED dice, each having a silicone-phosphor lens 48 formed using any of the processes described herein. Each LED (with its underlying submount portion) can be separated by sawing or breaking the submount 12 to form individual LED dice. Alternatively, the support structure 12 may be diced to support subgroups of LEDs or may be used without being diced.

The lens 48 infused with the phosphor not only affects the overall color but improves the light extraction from the LED die, refracts the light to create a desired emission pattern, and encapsulates the LED die to protect the die from contaminants, add mechanical strength, and protect any wire bonds.

The submounts may be mounted on a circuit board. The circuit board may be a metal plate (e.g., aluminum) with metal leads overlying an insulating layer.

The LED die 10 may also be a non-flip-chip die, with a wire connecting the top n or p-layers to a metal pad on the submount. The lens 48 may encapsulate the wire.

In one embodiment, the circuit board itself may be the support structure 12.

FIGS. 10-13 illustrate variations of the embodiments described above. These variations may be formed using any of the techniques described above.

Figure 10:
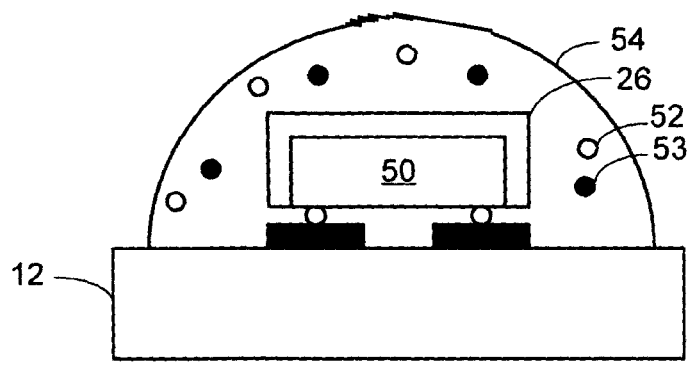
FIG. 10 is a side view of a blue, UV, or near UV LED with a conformal coating of one type of phosphor and a silicone lens containing one phosphor or two different phosphors to create white light.

FIG. 10 illustrates an LED die 50 with a conformal layer 26 of phosphor, where two different phosphors 52, 53 are mixed in the encapsulant material 54 (e.g., silicone). For example, the LED die 50 may emit a UV or near-UV light, the conformal layer 26 may convert some of that light to red, and the phosphors 52, 53 convert the LED light that leaks through to blue and green, respectively. Alternatively, the conformal layer 26 can be any of the three color phosphors, and the phosphors 52, 53 can be the remaining phosphors. More than two types of phosphors can be included in material 54 to create a desired white light temperature and broader spectrum of color.

Figure 11:
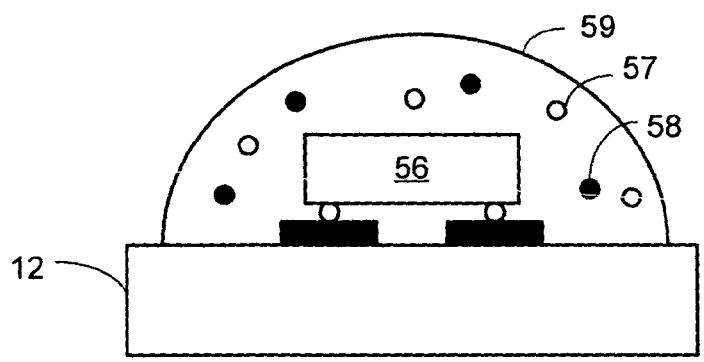
FIG. 11 is a side view of a blue LED, without a conformal coating, having a silicone lens containing two different phosphors to create white light.

FIG. 11 illustrates a blue LED 56 without a conformal layer of phosphor. Red and green phosphors 57, 58 are infused in the encapsulant 59 to create white light.

Figure 12:
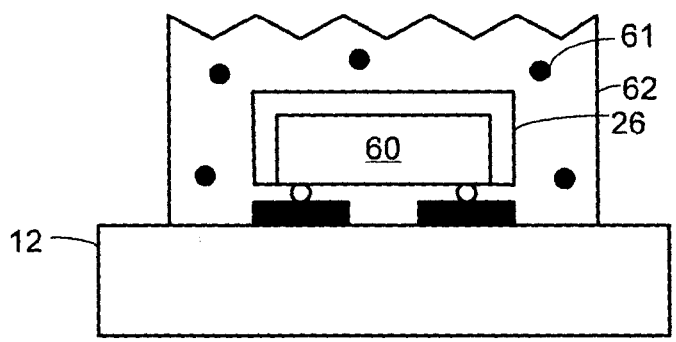
FIG. 12 is a side view of any of the above LEDs where the silicone lens, containing one or two types of phosphors, is formed as a Fresnel lens.

FIG. 12 illustrates an LED die 60 with a conformal layer 26 of phosphor and one or more phosphors 61 infused in the lens 62, where the lens 62 is molded as a Fresnel lens.

Lens 62 may also be a second lens overmolded on a first lens.

Figure 13:
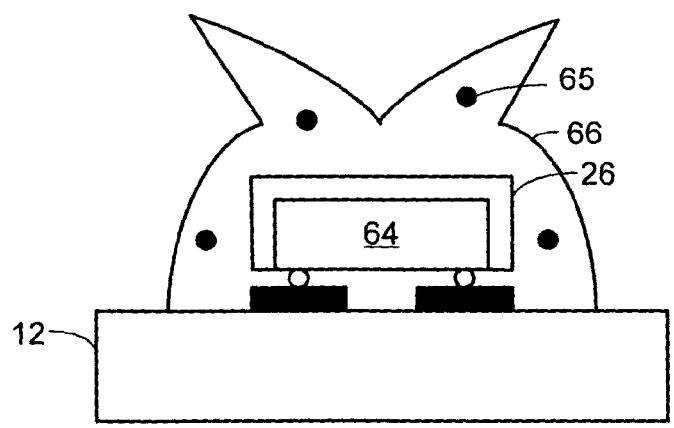
FIG. 13 is a side view of any of the above LEDs where the silicone lens, containing one or two types of phosphors, is formed as a wide angle emission lens.

FIG. 13 illustrates an LED die 64 with a conformal layer 26 of phosphor and one or more phosphors 65 infused in the lens 66, where the lens 66 is molded as a wide emitting lens. Lens 66 may also be a second lens overmolded on a first lens. Such a shape is possible using the technique of FIGS. 6-8 if the lens material is sufficiently soft when removing the lens from the mold.

In another embodiment, two conformal layers of phosphors are deposited by successive electrophoresis processes, where one layer is YAG (yellow, yellow-green, or green, depending on the dopant) and the other layer is CaS (red). A silicone lens then encapsulates the LED die.

Any of the LED dice described herein can emit blue, UV, or near-UV light. The phosphors will typically be used to create white light with a color temperature range of 2000K-5000K.

Some uses of the white light LEDs described herein include headlights for automobiles, flashlights, light for interior illumination, camera flashes, and backlights for liquid crystal displays.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting diode (LED) structure comprising:
   an LED die that emits blue light;
   a substantially flat layer of a first phosphor provided directly on at least a top surface of the LED die, the first phosphor having characteristics that convert the LED light to a different wavelength such that a combination of the blue light from the LED die and light generated by the first phosphor produces white light having a first color temperature; and
   a second phosphor infused in a transparent binder substantially encapsulating the LED die and the first phosphor, the transparent binder containing the second phosphor being molded to form an outer lens, the second phosphor not forming a substantially flat layer over the first phosphor and the outer lens being molded to refract light to create a desired light emission pattern, the outer lens not having any other layers over it, the second phosphor having characteristics that convert a color temperature of the white light emitted by the combination of the blue light from the LED die and light generated by the first phosphor to create white light having a second color temperature.

2. The structure of claim 1 wherein light emitted from the LED die is blue within the range of 420-490 nm.

3. The structure of claim 1 wherein the second color temperature of the white light is in the range of 2000K-5000K.

4. The structure of claim 1 wherein the first phosphor produces a yellow or yellow-green light when energized by the LED light, and the second phosphor produces a red light when energized by the LED light.

5. The structure of claim 1 further comprising a third phosphor mixed with the second phosphor in the binder for producing white light from the combination of at least the first phosphor, the second phosphor, and the third phosphor.

6. The structure of claim 1 wherein the first phosphor and the second phosphor are the only phosphors used to create the white light.

7. The structure of claim 1 wherein the first phosphor is deposited by electrophoresis.

8. The structure of claim 1 wherein the first phosphor is a YAG phosphor and the second phosphor is a CaS phosphor.

9. The structure of claim 1 wherein the transparent binder is silicone.

10. The structure of claim 1 wherein a thickness of the layer of the first phosphor is in the range of 15-35 microns.

11. The structure of claim 1 wherein any variation in the thickness of the layer of the first phosphor is less than about 15% of an average thickness of the layer of the first phosphor.

12. The structure of claim 1 wherein the transparent binder forms a lens to achieve a desired white light emission pattern.

* * * * *